United States Patent
Kondo et al.

(10) Patent No.: US 7,265,046 B2
(45) Date of Patent: Sep. 4, 2007

(54) METHOD OF MAKING A SOLDER BALL

(75) Inventors: Masuo Kondo, Ibaraki (JP); Fumiaki Kikui, Osaka (JP)

(73) Assignee: Neomax Material Co., Ltd., Osaka (JP)

( * ) Notice: Subject to any disclaimer, the term of this patent is extended or adjusted under 35 U.S.C. 154(b) by 196 days.

(21) Appl. No.: 10/529,172

(22) PCT Filed: Sep. 24, 2003

(86) PCT No.: PCT/JP03/12183

§ 371 (c)(1),
(2), (4) Date: Mar. 24, 2005

(87) PCT Pub. No.: WO2004/030428

PCT Pub. Date: Apr. 8, 2004

(65) Prior Publication Data

US 2006/0055054 A1    Mar. 16, 2006

(30) Foreign Application Priority Data

Sep. 27, 2002    (JP) ............................. 2002-283301
Oct. 3, 2002     (JP) ............................. 2002-291187

(51) Int. Cl.
*H01L 21/44* (2006.01)
(52) U.S. Cl. ............... 438/614; 438/612; 438/613; 438/615; 257/21.476
(58) Field of Classification Search ......... 438/612–616
See application file for complete search history.

(56) References Cited

U.S. PATENT DOCUMENTS

| | | | | | |
|---|---|---|---|---|---|
| 4,097,266 | A | * | 6/1978 | Takahashi et al. | 428/570 |
| 5,573,859 | A | * | 11/1996 | Suppelsa | 428/553 |
| 5,971,253 | A | * | 10/1999 | Gilleo et al. | 228/180.22 |
| 6,183,545 | B1 | | 2/2001 | Okuhama et al. | |
| 6,300,164 | B1 | * | 10/2001 | Call et al. | 438/108 |
| 6,337,445 | B1 | * | 1/2002 | Abbott et al. | 174/260 |
| 6,518,667 | B1 | * | 2/2003 | Ichida et al. | 257/738 |
| 6,610,591 | B1 | * | 8/2003 | Jiang et al. | 438/613 |

(Continued)

FOREIGN PATENT DOCUMENTS

JP    08-013185    1/1996

(Continued)

OTHER PUBLICATIONS

Katsuaki Suganuma, "Lead-free Soldering Technology—Trump of Environmentally Friendly Mounting", Kogyo Chosakai Publishing Inc., Jan. 20, 2001.

(Continued)

*Primary Examiner*—Scott B. Geyer
*Assistant Examiner*—Angel Roman
(74) *Attorney, Agent, or Firm*—Nixon Peabody LLP; Jeffrey L. Costellia (57) ABSTRACT

A solder ball 50 according to the present invention includes a spherical core 2 and a solder layer 4, which includes Sn and Ag and which is provided so as to wrap the core 2 up. The amount of water contained in the solder layer 4 is 100 µl/g or less when represented by the amount of water vapor in standard conditions.

21 Claims, 5 Drawing Sheets

U.S. PATENT DOCUMENTS

| | | | |
|---|---|---|---|
| 6,781,065 B1 * | 8/2004 | Palmteer | 174/260 |
| 7,053,491 B2 * | 5/2006 | Martin et al. | 257/782 |
| 2002/0046627 A1 | 4/2002 | Amita et al. | |
| 2002/0047216 A1 | 4/2002 | Jiang et al. | |
| 2002/0051728 A1 | 5/2002 | Sato et al. | |
| 2002/0071961 A1 | 6/2002 | Miura | |
| 2005/0260430 A1 | 11/2005 | Kuroda et al. | |

FOREIGN PATENT DOCUMENTS

| | | |
|---|---|---|
| JP | 10-036995 | 2/1998 |
| JP | 10-144813 | 5/1998 |
| JP | 10-270836 | 10/1998 |
| JP | 2000-34593 | 2/2000 |
| JP | 2001-150183 | 6/2001 |
| JP | 2001-220691 | 8/2001 |
| JP | 2001-332641 | 11/2001 |
| JP | 2002-57177 | 2/2002 |
| JP | 2002-239780 | 8/2002 |

OTHER PUBLICATIONS

Kohara et al., "Application of Sn and Ag Multi Plated Cu Core Pb Free Solder Ball to BGA Package", 7th Symposium on "Microjoining and Assembly Technology in Electronics", pp. 119-124, Feb. 1-2, 2001.

Nawafune et al., "Sn-Ag Alloy Electrodeposition from L-Tartrate Complex Bath", Surface Technology vol. 49, No. 7, pp. 759-763, 1998.

European Search Report EP 03 79 8471 mailed Oct. 25, 2005.

* cited by examiner

$\overline{100\mu m}$ (b)

US 7,265,046 B2

METHOD OF MAKING A SOLDER BALL

TECHNICAL FIELD

The present invention relates to a solder ball for use as an input/output terminal for a BGA or any other semiconductor device and a method of making the ball.

BACKGROUND ART

As computer-related equipment has had its performance further enhanced and its sizes further reduced and as information network equipment has become even more popular these days, it becomes increasingly necessary to realize even higher-density mounting with a printed circuit board for use in those types of equipment. In the past, a quad flatpack package (QFP) with lead terminals around its component would often be used as a member to realize high-density surface mounting. Recently, however, a ball grid array (BGA), which is relatively small in size and which can cope with multiple-pin applications, is used more and more often. The BGA may also be used as a spacer member when a quartz oscillator and a temperature-compensating IC are stacked one upon the other.

As shown in FIGS. 2(a) and 2(b), a ball grid array (BGA) is an LSI package in which solder balls 50 are bonded onto the lower surface of an LSI chip with an interposer 62 interposed between them. The solder balls 50 are arranged in matrix on one surface of the interposer 62, and are used as input/output terminals for the package. Each of these solder balls 50 is a tiny sphere with a diameter of about 0.1 mm to about 1.0 mm, and may be obtained by forming a solder layer on the surface of a metallic ball, for example.

If the solder layer of a lead-tin based material is deposited by an electroplating technique, then voids may be created in the solder layer while the solder balls are being heated, melted and bonded onto the pads of the interposer, which is a serious problem. The reason is that once those voids have been created, the interposer and the solder balls are either connected defectively or misaligned from each other, thus affecting the reliability of the BGA.

The applicant of the present application discovered that those voids were created by the hydrogen gas that was absorbed in the solder layer being formed by the electroplating technique, and could be minimized by reducing the absorption of that hydrogen gas. Based on this discovery, the applicant of the present application disclosed a method for minimizing the creation of voids by reducing the quantity of hydrogen gas absorbed into the solder layer with the ion concentrations of lead and tin in the plating solution and the current density during the electroplating process controlled (see Japanese Patent Application Laid-Open Publication No. 10-270836, pages 2 and 3, in particular).

In recent years, solder with lead is being replaced with solder with no lead (which is also called "Pb-free solder"). As the Pb-free solder, an Sn—Ag based solder or an Sn—Ag—Cu based solder is used, for example.

DISCLOSURE OF INVENTION

When a solder ball, including an Sn—Ag based solder layer, was made by an electroplating technique and heated and melted, voids were also created as in the solder ball including the lead-tin based solder layer described above. As a result of extensive researches, the present inventors discovered that those voids were not created by the hydrogen gas but another factor, which was unique to the Sn—Ag based solders as will be described later.

In order to overcome the problems described above, objects of the present invention are to provide a solder ball that includes an Sn—Ag based solder layer, in which the creation of voids is minimized while the solder layer is being heated and melted, a method of making such a ball, and a method of making a semiconductor interconnect structure.

A solder ball according to the present invention includes a spherical core and a solder layer, which includes Sn and Ag and which is provided so as to wrap the core up. The amount of water contained in the solder layer is 100 µl/g or less when represented by the amount of water vapor in standard conditions, whereby the problems described above are overcome.

The solder layer may include an Sn—Ag alloy.

The solder layer may include a first metal layer, which is provided so as to wrap the core up, and a second metal layer, which is provided so as to wrap the first metal layer up, and one of the first and second metal layers may include Sn and the other metal layer may include Ag.

The core is preferably made of Cu, Al or a resin.

The solder layer preferably includes 0.5 mass % to 4.0 mass % of Ag.

The solder layer preferably includes Cu, Sn and Ag.

The solder layer preferably includes 3.5 mass % of Ag.

A method of making a solder ball according to the present invention includes the steps of: preparing a spherical core; forming a plating layer, including Sn and Ag, by an electroplating technique such that the plating layer wraps the core up; heating the core with the plating layer, thereby keeping the plating layer molten for a predetermined period of time; and solidifying the molten plating layer, thereby making a solder layer, whereby the problems described above are overcome.

The step of forming the plating layer may include the step of forming an alloy plating layer including Sn and Ag.

The step of forming the plating layer may include the step of forming an additional plating layer including Ag.

The step of forming the plating layer may include the steps of forming a first plating layer, including Sn, such that the first plating layer wraps the core up, and forming a second plating layer, including Ag, such that the second plating layer also wraps the core up.

The solder layer may include Cu, Sn and Ag.

The solder layer preferably includes 0.5 mass % to 4.0 mass % of Ag.

The solder layer preferably includes 3.5 mass % of Ag.

Another solder ball according to the present invention is preferably made by one of the methods described above.

Another method of making a solder ball according to the present invention includes the steps of preparing a spherical core and forming a solder layer, including Sn and Ag, such that the solder layer wraps the core up. The step of forming the solder layer includes the step of forming a first solder layer, including an Sn—Ag alloy, by an electroplating process that uses a plating solution including 10 g/l to 25 g/l of tris(3-hydroxypropyl)phosphine, 15 g/l to 25 g/l of Sn organosulfonate, 0.3 g/l to 1.5 g/l of Ag organosulfonate, 50 g/l to 100 g/l of organic sulfonic acid, and ammonia. The first solder layer includes 0.5 mass % to 2.5 mass % of Ag, whereby the problems described above are overcome.

The plating solution preferably further includes 3 g/l to 12 g/l of thiourea.

The step of forming the solder layer may further include the step of forming a second solder layer including Ag.

The second solder layer may be formed by an electroplating process, an evaporation process or a colloidal process.

The second solder layer is preferably formed by the electroplating process and preferably has a thickness of at most 0.5 µm.

The solder layer preferably includes 3.0 mass % to 4.0 mass % of Ag.

The first solder layer preferably has a thickness of 3 µm to 50 µm.

The core is preferably made of Cu, Al or a resin.

The solder layer preferably includes 3.5 mass % of Ag.

The core preferably has a diameter of 0.05 mm to 1 mm.

Another solder ball according to the present invention is preferably made by one of the methods described above.

A method of making a semiconductor interconnect structure according to the present invention includes the steps of: preparing solder balls by one of the methods described above; preparing a board on which pads of a conductive material are arranged; putting and heating the solder balls on the pads, thereby turning the solder layer into a molten solder layer; and solidifying the molten solder layer, whereby the problems described above are overcome.

Another solder ball according to the present invention includes a spherical core and a solder layer, which includes Sn and Ag and which is provided so as to wrap the core up. The solder layer includes a first solder layer made of an Sn—Ag alloy. The first solder layer includes 0.5 mass % to 2.5 mass % of Ag. And the amount of water contained in the solder layer is 100 µl/g or less when represented by the amount of water vapor in standard conditions, whereby the problems described above are overcome.

The solder layer may further include a second solder layer, which is provided so as to wrap up the first solder layer, and the second solder layer preferably includes Ag and preferably has a thickness of at most 0.5 µm.

The solder layer preferably includes 3.0 mass % to 4.0 mass % of Ag.

The first solder layer preferably has a thickness of 3 µm to 50 µm.

The core is preferably made of Cu, Al or a resin.

The solder layer preferably includes 3.5 mass % of Ag.

The core preferably has a diameter of 0.05 mm to 1 mm.

A semiconductor device according to the present invention preferably includes one of the solder balls described above.

BEST MODE FOR CARRYING OUT THE INVENTION

In order to figure out why those voids were created while a solder ball, including an Sn—Ag based solder layer made by an electroplating process, was being heated and melted, the present inventors analyzed the gas emitted from the solder layer being heated and melted. As a result, the present inventors discovered that most of the gas emitted was water vapor. Based on this discovery, we acquired the following knowledge.

The water vapor, which was the main component of the emitted gas, was produced due to the vaporization of water, which was trapped in the solder layer being formed by the electroplating process, during the process step of heating and melting. That is to say, the water vapor was emitted from the solder layer being heated and melted, thereby creating those voids. Also, the water (i.e., that component to produce the water vapor under the heat) was trapped in the solder layer mainly because of the presence of Ag in the solder layer. Thus, it is believed to be because a hydrolytic product of Ag (such as Ag(OH)) was generated during the electroplating process.

Based on this knowledge, the present inventors acquired the basic idea of the present invention to be described below.

EMBODIMENT 1

Figure 1:
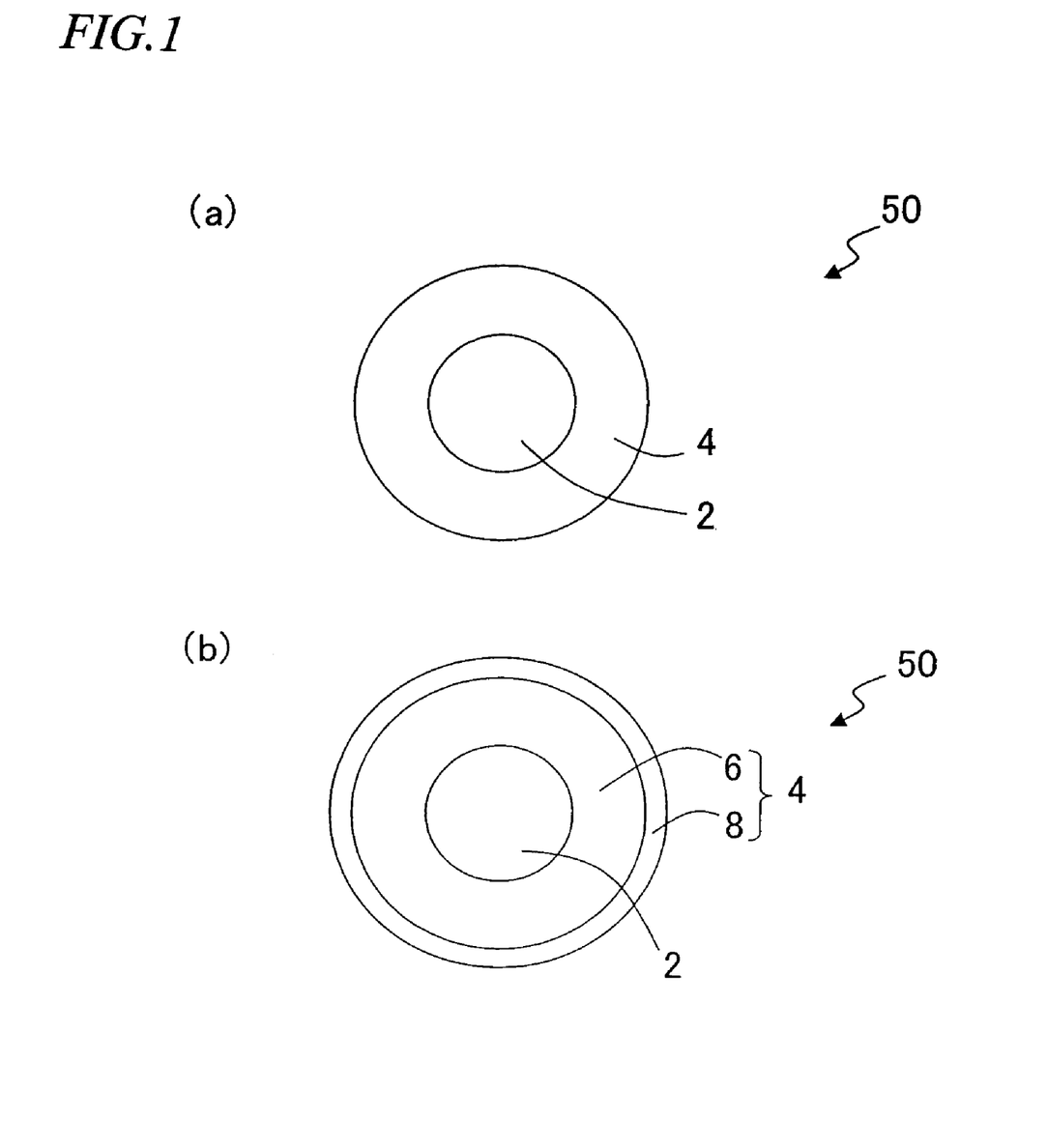
FIGS. 1(a) and 1(b) are cross-sectional views of solder balls according to first and second preferred embodiments of the present invention.

FIG. 1 is a cross-sectional view of a solder ball 50 according to a first preferred embodiment of the present invention. As shown in FIG. 1, the solder ball 50 includes a spherical core 2 and a solder layer 4, which includes Sn and Ag and which is provided so as to wrap up the core 2. The solder layer 4 may include either a single layer as shown in FIG. 1(a) or multiple layers as shown in FIG. 1(b). This solder layer 4 is controlled such that the amount of water contained in the solder layer 4 is 100 µl/g or less when represented by the amount of water vapor in standard conditions.

In this solder ball 50, the solder layer 4 is controlled so as to contain a sufficiently small amount of water as just described. Thus, the number of voids to be created while the solder layer 4 is being heated and melted can be reduced significantly. As will be described later for specific examples of the present invention, the present inventors confirmed via experiments that if the amount of water contained in the solder layer 4 was controlled to this value or less, the decrease in the bond strength of the solder balls 50, misalignment, and other defects could be reduced sufficiently.

The "amount of water" is supposed herein to be measured by the following method using a thermal desorption spectrometer (TDS) EMD-WA 100S (produced by ESCO. Ltd). Specifically, solder balls are put in an atmosphere that has been evacuated to a pressure of $2\times10^{-6}$ Pa or less and the temperature is raised from room temperature to 600° C. at a rate of 0.5° C./sec. In the meantime, the masses of gases produced are measured component by component with a quadrupole mass spectrometer. Regarding a gas component with a mass number of 18 as water, its total quantity is obtained and then converted into a volume in standard conditions. The volume is divided by the mass of the solder layer 4 to obtain the amount of water (µl/g). It should be noted that the mass of the solder layer 4 was calculated by subtracting the mass of the core 2 from that of the solder ball 50. The mass of this solder layer 4 was the average of the masses of approximately 100 samples. The masses of those approximately 100 solder balls 50 and cores 2 were measured with precision scales.

Figure 2:
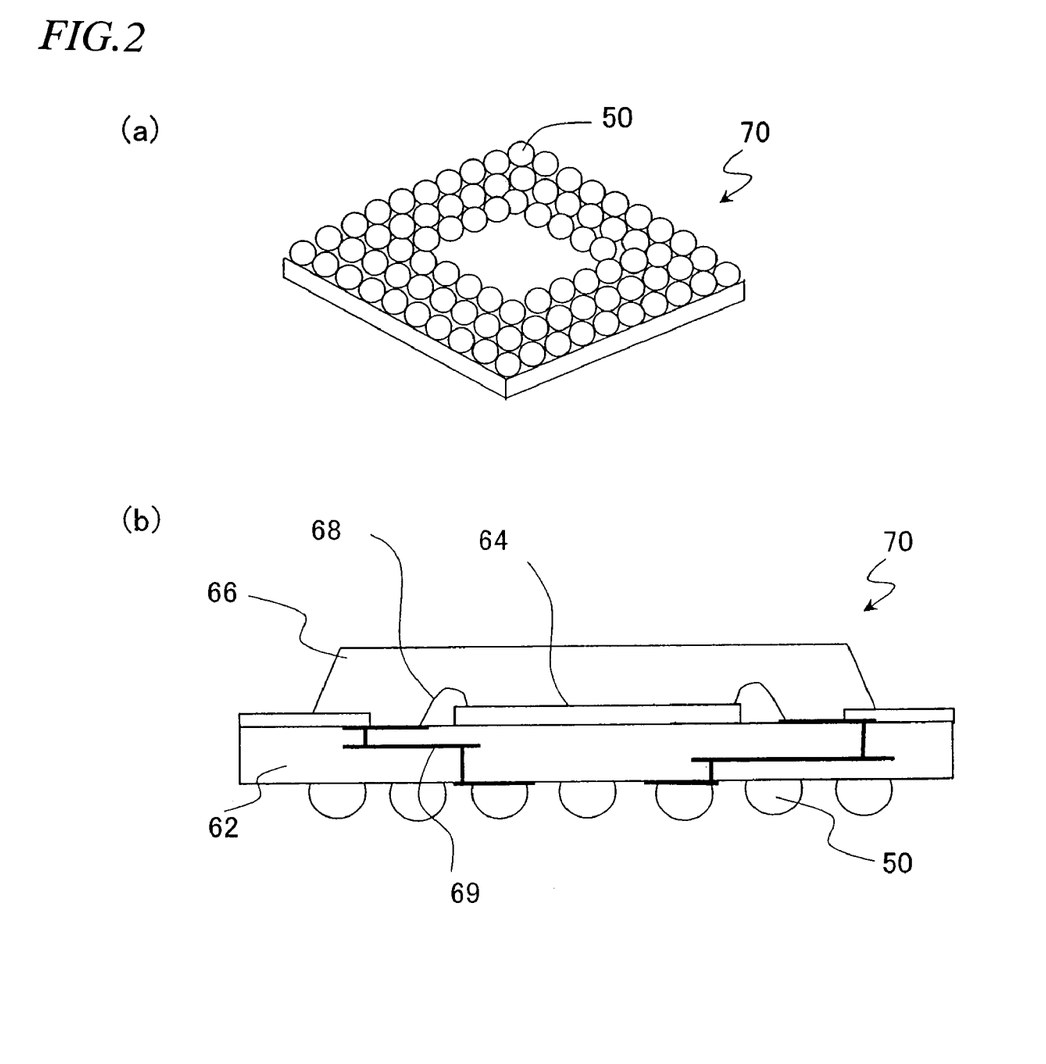
FIGS. 2(a) and 2(b) are respectively a perspective view and a cross-sectional view of a BGA that uses solder balls according to the first or second preferred embodiment of the present invention.

The solder balls 50 may be used as input/output terminals for BGAs and chip size packages (CSPs). FIG. 2 illustrates an exemplary BGA with solder balls 50. Specifically, FIGS. 2(a) and 2(b) are respectively a perspective view and a cross-sectional view of the BGA 70. As shown in FIGS. 2(a) and 2(b), the BGA 70 includes an interposer 62, a semiconductor chip 64 mounted on one side of the interposer 62, and a plurality of solder balls 50 bonded on the other side thereof. The solder balls 50 are arranged in matrix on the surface of the interposer 62 as shown in FIG. 2(*a*). The semiconductor chip 64 is encapsulated with a resin 66 and is electrically connected to the solder balls 50 by way of metal wires 68 and interconnects 69, which are provided in the interposer 62.

In the solder balls 50 of this preferred embodiment, the number of voids to be created in the heated and melted state can be reduced significantly as described above. Thus, the defective connection and misalignment, which might otherwise occur while the solder balls 50 are being fixed onto the interposer 62, can be minimized. As a result, the reliability of the BGA can be increased.

Hereinafter, the solder layer 4, of which the amount of water is controlled to 100 μl/g or less when represented by the amount of water vapor in standard conditions, will be described more fully.

The solder layer 4 may be a single plating layer including an Sn—Ag alloy as shown in FIG. 1(*a*).

Alternatively, the solder layer 4 may also have a multi-layer structure consisting of a plurality of metal layers as shown in FIG. 1(*b*). Specifically, in that case, the solder layer 4 consists of a first metal layer 6, which is provided so as to wrap up the core 2, and a second metal layer 8, which is provided so as to wrap up the first metal layer 6. One of the first and second metal layers 6 and 8 is a layer including Sn, while the other layer is a layer including Ag. Thus, even if the solder layer 4 has a multilayer structure, soldering is realized (at least in the bonded state) substantially in the same way as in the situation where the solder layer 4 is made of an Sn—Ag alloy. It should be noted that when the solder layer 4 has such a multilayer structure, the composition of the solder layer 4 can be controlled by adjusting the thicknesses of respective layers that make up the solder layer 4.

If the solder layer 4 has a multilayer structure as shown in FIG. 1(*b*), then the thicknesses of the first and second metal layers 6 and 8 are determined according to the desired composition ratio of solder. Also, the Sn-containing layer and the Ag-containing layer may be provided in any order as the first and second metal layers 6 and 8. However, it is preferable that one of the two layers with the higher oxidation resistance is provided as the outer layer (i.e., the second metal layer 8). Accordingly, when the solder layer 4 is made up of an Sn layer and an Ag layer, for example, the Ag layer is preferably provided as the second metal layer 8.

The mass percentage of Ag in the solder layer 4 is appropriately determined according to the desired composition of the solder. Typically, the mass percentage of Ag contained is preferably 0.5 mass % to 4.0 mass %.

The core 2 may be made of Cu, for example. In that case, Cu diffuses from the core 2 into the solder layer 4 being heated, and Sn and Ag, included in the solder layer 4, and that Cu become the respective constituent materials of the solder. That is to say, an Sn—Ag—Cu based solder is obtained.

If the core 2 is made of Cu, then the mass percentage of Ag included in the solder layer 4 is preferably set to about 2 mass % to 4 mass %, more preferably about 3.5 mass %. This is because as long as the mass percentage of Ag included in the solder layer 4 falls within this range, a ternary eutectic reaction of Sn—Ag—Cu occurs and a single melting point of about 216° C. is obtained when the solder layer 4 is heated. Also, this melting point of about 216° C. is lower than that of a binary eutectic Sn—Ag (about 221° C.). The melting point was supposed to be the onset temperature of a DTA curve that was measured at a temperature rise rate of 2° C./min (i.e., melting start temperature).

It should be noted that if the solder layer has a eutectic composition, various advantages are achieved. For example, in the molten state, the solder layer exhibits high flowability and guarantees good work efficiency. Plus, the solidified solder has such highly uniform composition and texture as to exhibit high mechanical strength, shear strength, tensile strength and shock resistance. That is why such a solder layer with a eutectic composition is preferably used.

However, the material of the core 2 does not have to be Cu. Alternatively, the core 2 may also be made of either a metal such as Al or a resin. If the core 2 is made of a resin, then a layer of Ni or any other suitable metal is preferably formed on the surface of the core 2 by an electroless plating technique, for example, and then the solder layer 4 is preferably deposited thereon by an electroplating technique.

Hereinafter, an exemplary method of making the solder ball 50 will be described.

In a first method, a plating layer is dehydrated by heating and melting it.

First, a spherical core 2 is prepared. Next, a plating layer, including Sn and Ag, is deposited thereon by an electroplating technique so as to wrap up the core 2.

The plating layer may be formed by electroplating an Sn—Ag alloy. Alternatively, the plating layer may also be formed by electroplating an Sn—Ag alloy (i.e., making a first plating layer) and then electroplating Ag (i.e., making a second plating layer). As another alternative, the plating layer may also be formed by electroplating Sn (i.e., making a first plating layer) and then electroplating Ag (i.e., making a second plating layer). There is a big difference in standard electrode potential between Sn and Ag. Accordingly, if an Sn—Ag alloy is electroplated on an industrial basis, then the plating conditions need to be controlled, and the plating solution needs to be managed, with high precision. In contrast, if the plating layer is made up of a plating layer including Sn and a plating layer including Ag, then no such high precision control or management is required. Consequently, the electroplating process can be carried out more easily.

Next, the core 2, on which the plating layer (consisting of either a single layer or multiple layers) has been deposited, is heated, thereby keeping the plating layer molten in a predetermined amount of time.

This heating and melting process step is carried out by putting the solder ball 50 on a surface with low solder wettability (e.g., on a stainless steel or ceramic substrate) and keeping the ball 50 heated to a prescribed temperature in a predetermined amount of time within an inert atmosphere of Ar, for example, of which the pressure was set equal to the atmospheric pressure. The heating temperature is defined several tens ° C. higher than the melting point of the final material of the solder layer 4. For example, if the core 2 is made of Cu, the plating layer is made of an Sn—Ag alloy, and the mass percentage of Ag included in the plating layer is about 3.5 mass % (where the melting point (i.e., the ternary eutectic point) of the materials of the solder layer 4 is 216° C.), then the solder ball 50 is heated to about 240° C. The predetermined amount of time is preferably 10 to 30 minutes.

By heating the plating layer and keeping it molten in a predetermined amount of time as described above, the water trapped in the plating layer during the electroplating process can be removed. As a result, the solder ball 50, in which the amount of water contained in the solder layer 4 is controlled to 100 μl/g or less when represented by the amount of water vapor in standard conditions, can be obtained.

In a second method, the solder layer 4 has a multilayer structure consisting of two metal layers of Sn and Ag as shown in FIG. 1(b) and the Ag layer is formed by a non-electroplating technique, e.g., an evaporation process. As described above, if a metal layer including Ag is formed by an electroplating technique, water will be trapped in that metal layer. Thus, the Ag layer is formed by a non-electroplating technique. Consequently, the solder ball 50, in which the amount of water contained in the solder layer 4 is controlled to the above value or less, can be obtained.

In the following description, various interconnect structures, in which solder balls may be used for an element or device including a semiconductor chip at least, will be collectively referred to herein as "semiconductor interconnect structures". Such a semiconductor interconnect structure may be made by the following method, for example.

Figure 3:
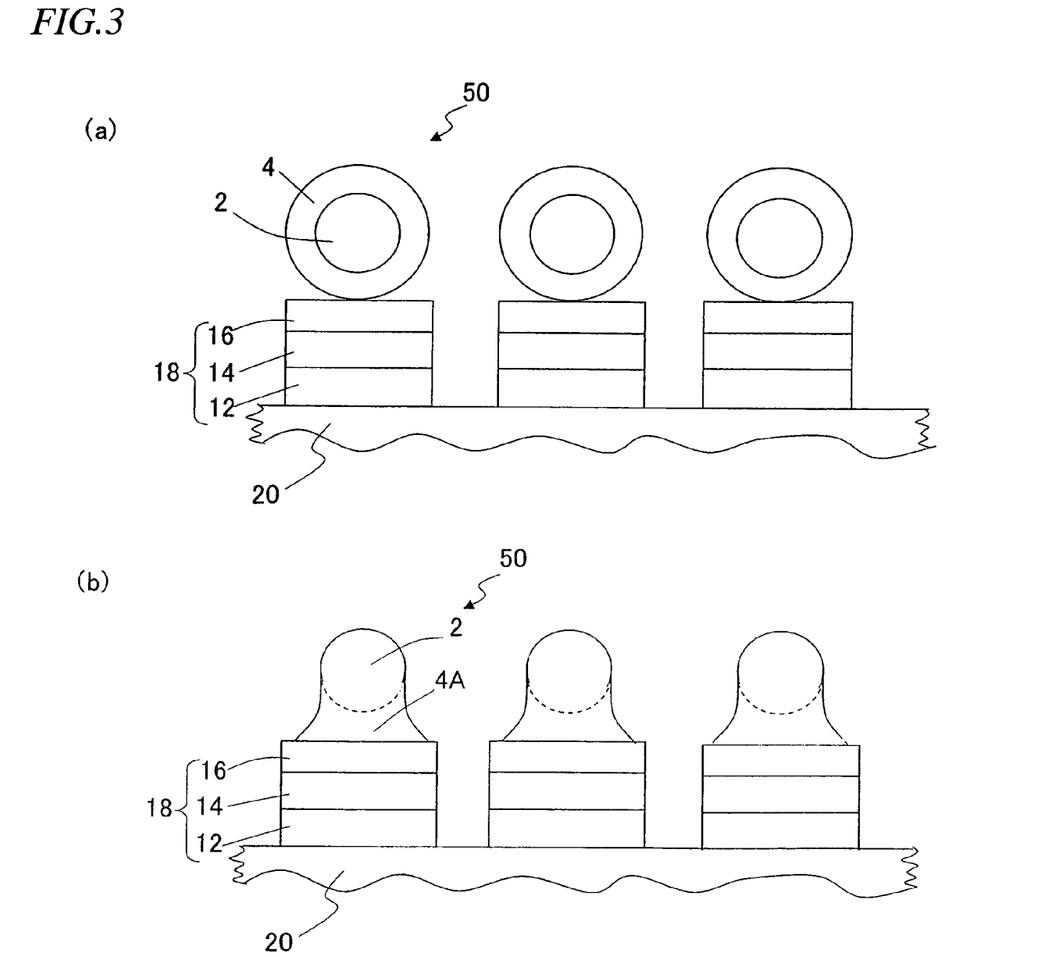
FIGS. 3(a) and 3(b) illustrate a method of making a semiconductor interconnect structure according to the present invention.

First, as shown in FIG. 3(a), solder balls 50 and a desired substrate 20, on which the solder balls 50 will be bonded, are prepared. The substrate 20 may be used as an interposer for a BGA (see FIG. 2) or a CSP. On the principal surface of the substrate 20, pads 18 of conductive materials are provided. Each of those pads 18 may be a stack of a Cu layer 12, a Ni plating layer 14 and an Au plating layer 16, for example. Next, the solder balls 50 on the pads 18 are heated, thereby melting the solder layer 4 as shown in FIG. 3(b), where the molten solder layer is identified by the reference numeral 4A. Then, the molten solder layer 4A is cooled, solidified, and thereby bonded onto the pads 18. By performing these process steps, a semiconductor interconnect structure is formed.

In this semiconductor interconnect structure, the solder balls 50 are bonded to the substrate 20 with so strongly that misalignment and other inconveniences are rarely caused. As a result, a highly reliable semiconductor interconnect structure can be provided.

Hereinafter, specific examples of the present invention will be described. The solder balls of this preferred embodiment are preferably formed by an electroplating process. However, the electroplating process does not have to be carried out as described below but may be performed following a known procedure. For instance, an alkane sulfonic acid bath (see Japanese Patent Application Laid-Open Publications Nos. 8-13185 and 12-34593, for example) will be used as a plating solution for plating an Sn—Ag alloy in the following specific examples. Alternatively, a gluconic acid-iodide bath (see Japanese Patent Application Laid-Open Publication No. 10-36995, for example) or a tartaric acid bath (see "Su-Ag Alloy Electrodeposition from L-Tartrate Complex Bath" Surface Technology Vol. 49, No. 7 (1998) pp.759-763, for example) may also be used.

EXAMPLE 1

In a solder ball 50 representing a first specific example of the present invention, the solder layer 4 is a single Sn—Ag alloy layer. Hereinafter, a method of making the solder ball 50 of the first specific example will be described.

First, a spherical copper core with a diameter of 0.8 mm is pre-processed with a 17.5% HCl aqueous solution at room temperature for one minute (process step (a)). Next, the core is washed (immersed for one minute and rinsed for one minute) with pure water at room temperature (process step (b)). Subsequently, the core is immersed in an organic acid at room temperature for 30 seconds (process step (c)). Thereafter, the core is plated with a plating solution including tin methanesulfonate (24 g/l of Sn), silver methanesulfonate (1.4 g/l of Ag), sulfonic acid, hydroxycarboxylic acid, organophosphorus compound and thiourea (300° C.) at a current density of 0.30 A/dm$^2$, thereby forming an Sn—Ag alloy plating layer (with a thickness of 35 μm) (step (d)). Then, the plating layer is washed (immersed for one minute and rinsed for one minute) with pure water at room temperature (process step (e)). These process steps (a) through (e) are carried out within a barrel container. Thereafter, the solder ball is picked out of the barrel container, washed (immersed for two minutes and rinsed for two minutes) with pure water at room temperature (process step (f)) and then dried at 60° C. for 10 minutes (process step (g)). Finally, this solder ball is dehydrated by heating it at 240° C. for 10 minutes within an Ar atmosphere at the atmospheric pressure.

In this manner, a solder ball representing the first specific example (including 3.5 mass % of Ag) was obtained.

EXAMPLE 2

In a solder ball 50 representing a second specific example of the present invention, the solder layer 4 consists of an Sn plating layer 6 and an Ag evaporation layer 8. Hereinafter, a method of making the solder ball 50 of the second specific example will be described.

First, a spherical copper core with a diameter of 0.5 mm is pre-processed with a 17.5% HCl aqueous solution at room temperature for one minute (process step (a)). Next, the core is washed (immersed for one minute and rinsed for one minute) with pure water at room temperature (process step (b)). Subsequently, the core is immersed in an organic acid at room temperature for 30 seconds (process step (c)). Thereafter, the core is plated with a plating solution including tin methanesulfonate (60 g/l of Sn) (40° C.) at a current density of 0.30 A/dm$^2$, thereby forming an Sn plating layer (with a thickness of 34.2 μm) (step (d)). Then, the plating layer is washed (immersed for one minute and rinsed for one minute) with pure water at room temperature (process step (e)). These process steps (a) through (e) are carried out within a barrel container. Thereafter, the solder ball is picked out of the barrel container, washed (immersed for two minutes and rinsed for two minutes) with pure water at room temperature (process step (f)) and then dried at 60° C. for 10 minutes (process step (i)). Next, the pressure is reduced to 1×10$^{-4}$ Pa, Ar is introduced as an inert gas, and an Ag film (with a thickness of 0.8 μm) is deposited at a pressure of 1×10$^{-2}$ Pa by an ion plating process (process step (g)). Then, the solder ball is washed again (immersed for two minutes and rinsed for two minutes) with pure water at room temperature (process step (h)) and then dried at 60° C. for 10 minutes (process step (i)).

In this manner, a solder ball representing the second specific example (including 3.7 mass % of Ag) was obtained.

EXAMPLE 3

In a solder ball 50 representing a third specific example of the present invention, the solder layer 4 consists of an Sn plating layer 6 and an Ag plating layer 8. Hereinafter, a method of making the solder ball 50 of the third specific example will be described.

First, a spherical copper core with a diameter of 0.3 mm is pre-processed with a 17.5% HCl aqueous solution at room temperature for one minute (process step (a)). Next, the core is washed (immersed for one minute and rinsed for one minute) with pure water at room temperature (process step (b)). Subsequently, the core is immersed in an organic acid at room temperature for 30 seconds (process step (c)). Thereafter, the core is plated with a plating solution including tin methanesulfonate (60 g/l of Sn) (40° C.) at a current density of 0.30 A/dm², thereby forming an Sn plating layer (with a thickness of 10 μm)(step (d)). Then, the plating layer is washed (immersed for one minute and rinsed for one minute) with pure water at room temperature (process step (e)). Next, the Sn plating layer is further plated with a plating solution including silver iodide (20 g/l of Ag) (40° C.) at a current density of 0.10 A/dm², thereby forming an Ag plating layer (with a thickness of 0.24 μm) (step (f)). Then, the plating layer is washed with pure water at room temperature (process step (g)). These process steps (a) through (g) are carried out within a barrel container. Thereafter, the solder ball is picked out of the barrel container, washed (immersed for two minutes and rinsed for two minutes) with pure water at room temperature (process step (h)) and then dried at 60° C. for 10 minutes (process step (i)). In this manner, a solder ball 50 representing the third specific example (including 3.6 mass % of Ag) was obtained.

In the solder ball 50 of the third specific example, the Ag plating layer was relatively thin, and therefore, the amount of water contained in the solder layer could be reduced sufficiently even without heating, melting and dehydrating the solder layer. However, if the Ag plating layer is so thick that the amount of water contained in the solder layer exceeds 100 μl/g when represented by the amount of water vapor in standard conditions, the process step of dehydrating the solder layer by heating and melting it may be carried out after the step (i) as in the first specific example described above. Then, the amount of water can be reduced sufficiently.

COMPARATIVE EXAMPLES 1, 2 AND 3

For the purpose of comparison, solder balls representing first, second and third comparative examples were made. In each of the solder balls of the first through third comparative examples, the solder layer 4 was a single Sn—Ag alloy layer and was not dehydrated by heating and melting it.

The solder ball of the first comparative example was made by the same method as that of the first specific example described above except that the solder layer was not dehydrated by heating and melting it.

The solder ball of the second comparative example was made by the same method as that of the first comparative example except that a spherical copper core with a diameter of 0.5 mm was used. The solder ball of the second comparative example included 3.7 mass % of Ag.

The solder ball of the third comparative example was made by the same method as that of the first comparative example except that a spherical copper core with a diameter of 0.3 mm was used and that the solder layer had a thickness of 10 μm. The solder ball of the third comparative example included 3.6 mass % of Ag.

Evaluation

To evaluate the solder balls of the specific and comparative examples, the amounts of water contained in respective solder balls were calculated. Also, those solder balls were heated and melted to count the number of voids created and measure the maximum diameter thereof, and were also photographed. Furthermore, those solder balls were subjected to a bonding test.

Figure 4:
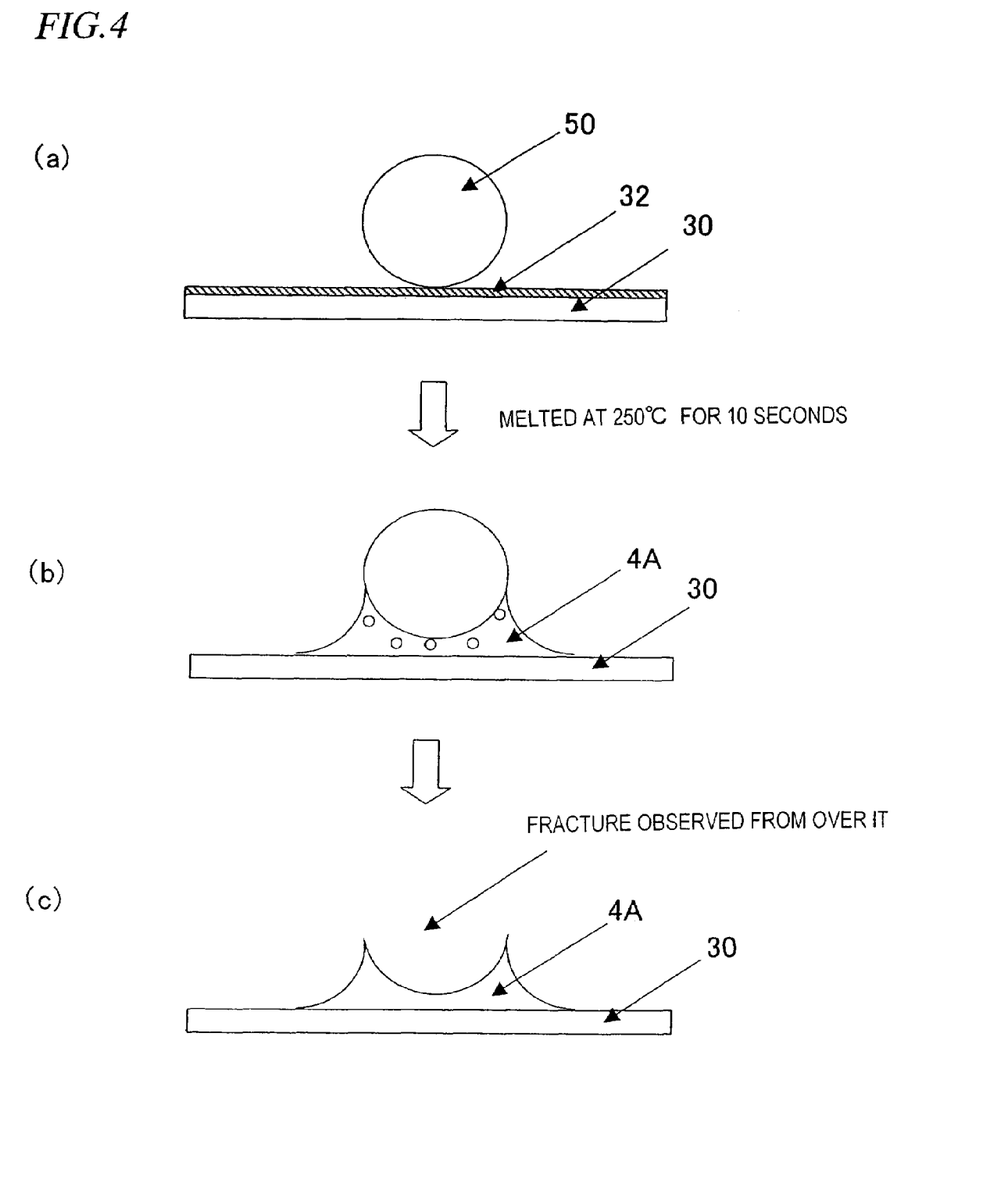
FIGS. 4(a), 4(b) and 4(c) show how to spot voids.

The maximum diameter and the number of voids were obtained in the following manner. First, as shown in FIG. 4(a), the solder ball was put on a Cu substrate 30 with a flux 32 interposed on the principal surface thereof. Next, as shown in FIG. 4(b), the solder ball was heated at 250° C. for 10 seconds, thereby melting the solder layer 4 (i.e., turning it into molten solder 4A). Thereafter, as shown in FIG. 4(c), the Cu core portion was removed from the solder ball. The fracture, exposed by removing the Cu core, was photographed from over it, the number of voids created on the fracture was counted, and the maximum diameter thereof was measured. Only the number of voids with diameters of at least 10 μm was counted.

The bonding test was carried out in the following manner. Specifically, 100 solder balls were put on the Cu substrate 30 as shown in FIG. 4(a). Next, as shown in FIG. 4(b), the solder layer 4 was heated and melted and then cooled and solidified, thereby bonding the solder layer 4 onto the substrate 30. This heating and melting process step was carried out by loading the substrate 30, on which the solder balls were arranged, in an oven having an internal temperature of 250° C. and replaced with a nitrogen atmosphere for 10 seconds. Thereafter, the substrate 30 was unloaded from the oven and then cooled by itself to room temperature.

Then, it was counted how many solder balls came off (or dropped from) the substrate 30 among the 100 balls obtained by the method described above.

Results

Figure 5:
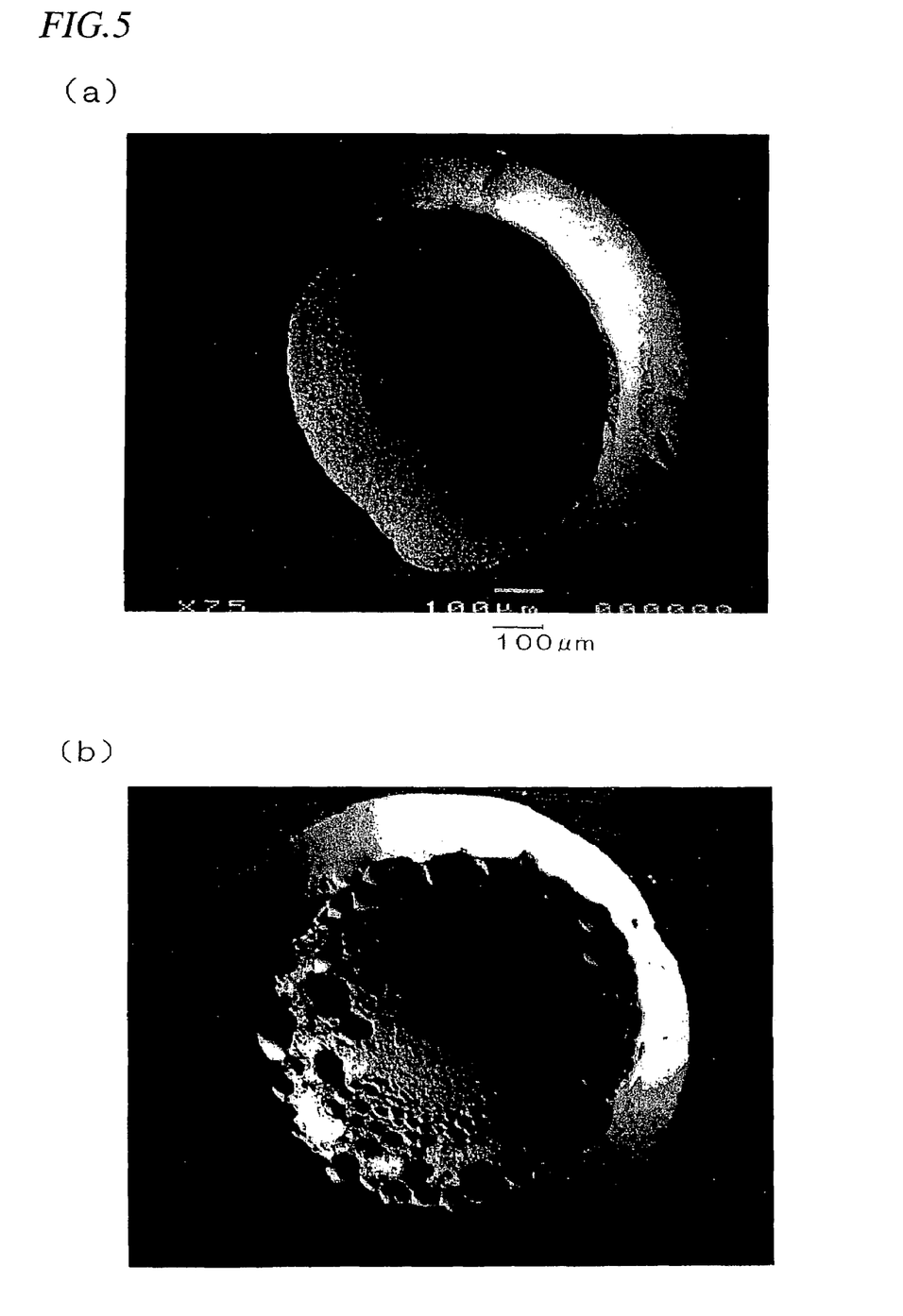
FIGS. 5(a) and 5(b) are photographs that were taken of the first specific example and the first comparative example, respectively.

The photographs of the first specific example and the first comparative example are shown in FIGS. 5(a) and 5(b), respectively.

The amounts of water contained, the numbers of voids created and its maximum diameter measured for the first to third specific examples and the first to third comparative examples and the numbers of balls dropped in the bonding test are shown in the following Table 1:

TABLE 1

| | Amount of water (μl/g) | Maximum void diameter (μm) | Number of voids | Number of balls dropped (in 100 balls) |
|---|---|---|---|---|
| Example 1 | 30 | — | 0 | 0 |
| Example 2 | 65 | — | 0 | 0 |
| Example 3 | 80 | — | 0 | 0 |
| Comp. Ex. 1 | 190 | 80 | 12 | 1 |
| Comp. Ex. 2 | 180 | 60 | 15 | 2 |
| Comp. Ex. 3 | 180 | 55 | 9 | 1 |

As can be seen from Table 1, each of the solder balls of the first through third specific examples contained an amount of water of less than 100 μl/g, whereas each of the solder balls of the first through third comparative examples contained an amount of water exceeding 100 μl/g and in the range of 180 μl/g to 190 μl/g. It should be noted that the solder ball of the first specific example contained an amount of water of 190 μl/g (corresponding with that of the first comparative example) before dehydrated by heating and melting it but contained an amount of water of 30 μg/l after dehydrated by heating and melting it.

As can be seen from FIG. 5(a) and Table 1, no voids were detected at all in the first through third specific examples, while 9 to 15 voids with diameters of 55 to 80 μm were detected per mm² in the first through third comparative examples. Thus, the present inventors confirmed that the creation of voids was minimized effectively in the solder ball of this specific example containing an amount of water of less than 100 µl/g. As also can be seen from Table 1, no bonding failures were spotted at all in the first through third specific examples, while few bonding failures were spotted in the first through third comparative examples. Consequently, the solder ball of this specific example turned out to be bondable even more firmly.

EMBODIMENT 2

In a solder ball according to a second preferred embodiment of the present invention, the amount of water contained in the solder layer 4, including Sn and Ag, is controlled to 100 µl/g or less when represented by the amount of water vapor in standard conditions as in the solder ball of the first preferred embodiment described above. Thus, just like the first preferred embodiment, the number of voids to be created while the solder layer 4 is being heated and melted can be reduced significantly. Also, as will be described later for specific examples of the present invention, the present inventors confirmed via experiments that if the amount of water contained in the solder layer 4 was controlled to this value or less, the decrease in the bond strength of the solder balls 50, misalignment, and other defects could be reduced sufficiently.

The second preferred embodiment is mainly characterized in that the solder layer includes an Sn—Ag alloy solder layer to be made by an electroplating process using a predetermined plating solution.

Hereinafter, the solder ball 50 of the second preferred embodiment will be described with reference to FIGS. 1(*a*) and 1(*b*).

As long as the solder ball of this second preferred embodiment includes at least one Sn—Ag alloy solder layer, the solder layer may consist of either just one layer as shown in FIG. 1(*a*) or a plurality of layers as shown in FIG. 1(*b*).

If the solder layer 4 consists of a single layer, then the solder ball 50 includes a core 2 and a solder layer 4 made of an Sn—Ag alloy as shown in FIG. 1(*a*).

On the other hand, if the solder layer 4 consists of multiple layers, then the solder ball 50 includes a solder layer 4, which is made up of a first metal layer 6 and a second metal layer 8 that is provided so as to wrap up the first metal layer 6. For example, the first metal layer 6 may be a solder layer made of an Sn—Ag alloy, while the second metal layer 8 may be a solder layer of Ag. The first and second metal layers 6 and 8 will be referred to herein as a "first solder layer" 6 and a "second solder layer" 8, respectively.

Even if the solder layer 4 has a multilayer structure as shown in FIG. 1(*b*), soldering is realized (at least in the bonded state) substantially in the same way as in the situation where the solder layer 4 is made of an Sn—Ag alloy as shown in FIG. 1(*a*). It should be noted that when the solder layer 4 has such a multilayer structure, the composition of the solder layer 4 can be controlled by adjusting the thicknesses of respective layers that make up the solder layer 4.

Hereinafter, a method of making the solder ball 50 shown in FIG. 1(*a*) will be described.

First, a spherical core 2 is prepared.

Next, a solder layer 4 made of an Sn—Ag alloy is deposited by an electroplating process so as to wrap up the core 2. As the plating solution, a solution including 10 g/l to 25 g/l of tris(3-hydroxypropyl)phosphine, 15 g/l to 25 g/l of Sn organosulfonate, 0.3 g/l to 1.5 g/l of Ag organosulfonate, 50 g/l to 100 g/l of organic sulfonic acid, and ammonia is used. Ammonia is added to adjust the PH of the solution. The PH is preferably controlled within the range of 3.5 to 5.0. As the Sn organosulfonate, Ag organosulfonate, and organic sulfonic acid, Sn methanesulfonate, Ag methanesulfonate and methanesulfonic acid are preferably used, respectively, as will be described later for specific examples of the present invention. More preferably, the plating solution further includes 3 g/l to 12 g/l of thiourea. This plating solution is described in detail in Japanese Patent Application Laid-Open Publication No. 2000-34593.

The solder layer 4 is made of this plating solution so as to include at most 2.5 mass % of Ag. The electroplating process is preferably carried out with the current density controlled to the range of 0.1 $A/dm^2$ to 0.6 $A/dm^2$ and with the temperature of the plating solution controlled to the range of 20° C. to 30° C.

By performing these process steps, the solder ball 50 can be obtained with the amount of water contained in the solder layer 4 controlled to 100 µl/g or less when represented by the amount of water vapor in standard conditions. If the electroplating process is carried out with the predetermined plating solution described above, the amount of water contained in the solder layer 4 can be reduced sufficiently without conducting any special-purpose treatment separately.

To make the solder layer 4 include more than 2.5 mass % of Ag, the solder layer 4 preferably has a multilayer structure as shown in FIG. 1(*b*). The solder layer 4 including more than 2.5 mass % of Ag has a finer crystal structure when melted. As a result, the bond strength of the solder ball 50 can be increased.

Such a solder ball 50, of which the solder layer has a multilayer structure, may be made by forming the first solder layer 6 by the electroplating process described above and then the second solder layer 8 including Ag. When the solder layer 4 has a multilayer structure, the first solder layer 6 preferably includes at least 0.5 mass % of Ag. Then, the surface roughness of the first solder layer 6 can be reduced sufficiently. As a result, the first and second solder layers 6 and 8 can contact with each other even more closely. The second solder layer 8 of Ag may be made by an electroplating process, an evaporation process or a colloidal process, for example.

If the second solder layer 8 is formed by an electroplating process, then the thickness of the second solder layer 8 is defined to be 0.5 µm or less. As described above, it would be mainly because of the presence of Ag component that water is trapped in a solder layer formed by an electroplating process. Thus, by making the Ag layer sufficiently thin, the amount of water trapped in the solder layer can be reduced.

On the other hand, if the second solder layer 8 is formed by a non-electroplating method, then the thickness thereof does not have to be set to 0.5 µm or less. However, when the thickness is equal to or smaller than this value, the solder layer in the molten state is likely to have a uniform composition, and therefore, the creation of abnormal grains can be minimized.

According to the method described above, a solder ball 50, of which the solder layer 4 includes more than 2.5 mass % of Ag and in which the amount of water contained in the solder layer 4 is controlled to 100 µl/g or less when represented by the amount of water vapor in standard conditions, can be obtained.

The thicknesses of the first and second solder layers 6 and 8 are determined according to the desired composition ratio of solder. Optionally, it is not impossible to make the solder ball 50 shown in FIG. 1(*b*) such that the first solder layer 6 is an Ag layer and the second solder layer 8 is an Sn—Ag alloy layer. However, it is preferable that one of the two layers with the higher oxidation resistance is provided as the outer layer (i.e., the second solder layer 8). Specifically, there is a mixture of grains with various compositions in the Sn—Ag alloy layer. Accordingly, if a solder ball, of which the second solder layer 8 is an Sn—Ag alloy layer, were left in the air for a long time, then its surface would be easily oxidized, corroded and deformed, and its wettability and bond strength would decrease while the solder ball is soldered. That is why it is preferable that the first solder layer 6 is an Sn—Ag alloy layer and the second solder layer 8 is an Ag layer.

Also, the solder layer 4 preferably includes 3.0 mass % to 4.0 mass % of Ag. This is because if the mass percentage of Ag included in the solder layer 4 is approximately 3.5 mass %, then an Sn—Ag binary eutectic reaction will occur and a single melting point of about 221° C. can be obtained when the solder layer is heated. As will be described later, if the solder layer has a eutectic composition, various advantages are achieved. For example, the bond strength thereof can be increased sufficiently. Also, if the mass percentage of Ag exceeded 4.0 mass %, then $Ag_3Sn$ plate-like initial crystals (or needle-like initial crystals) with excessively large grain sizes of several tens of μm would be crystallized due to the heat to create cracks in the solder layer. That is why the mass percentage of Ag is preferably at most 4.0 mass % (see Katsuaki Suganuma, "Lead-free Soldering Technology—Trump of Environmentally Friendly Mounting", Kogyo Chosakai Publishing Inc., Jan. 20, 2001).

The core 2 may be made of Cu, for example. In that case, Cu diffuses from the core 2 into the solder layer 4 being heated, and Sn and Ag, included in the solder layer 4, and that Cu become the respective constituent materials of the solder. That is to say, an Sn—Ag—Cu based solder is obtained.

If the core 2 is made of Cu, then the mass percentage of Ag included in the solder layer 4 is preferably set to 2.0 mass % to 4.0 mass %, more preferably about 3.5 mass %. This is because as long as the mass percentage of Ag included in the solder layer 4 falls within this range, a ternary eutectic reaction of Sn—Ag—Cu occurs and a single melting point of about 216° C. is obtained when the solder layer 4 is heated. Also, this melting point of about 216° C. is lower than that of a binary eutectic Sn—Ag (about 221° C.). The melting point was supposed to be the onset temperature of a DTA curve that was measured at a temperature rise rate of 2° C./min (i.e., melting start temperature).

It should be noted that if the solder layer has a eutectic composition, various advantages are achieved. For example, in the molten state, the solder layer exhibits high flowability and guarantees good work efficiency. Plus, the solidified solder has such highly uniform composition and texture as to exhibit high mechanical strength, shear strength, tensile strength and shock resistance. That is why such a solder layer with a eutectic composition is preferably used.

However, the material of the core 2 does not have to be Cu. Alternatively, the core 2 may also, be made of either a metal such as Al or a resin. If the core 2 is made of a resin, then a layer of Ni or any other suitable metal is preferably formed on the surface of the core 2 by an electroless plating technique, for example, and then the solder layer 4 is preferably deposited thereon by an electroplating technique.

The diameter of the core 2 typically falls within the range of 0.05 mm to 1 mm. As long as the size of the core 2 falls within this range, sufficiently high bond strength is achieved during the soldering process. Also, the balls can be bonded onto a substrate, for example, at a rather high density. The solder layer 4 or 6 made of the Sn—Ag alloy typically has a thickness of 3 μm to 50 μm.

Just like the solder ball 50 of the first preferred embodiment described above, the solder ball 50 of this second preferred embodiment may also be used as an input/output terminal for a BGA (see FIG. 2) or a CSP, for example. By using this solder ball 50, the number of voids to be created while the solder ball 50 is being heated and melted can be reduced significantly. Thus, defective connection or misalignment can be minimized when the solder balls 50 are fixed onto the interposer 62. As a result, the reliability of the BGA can be increased.

In addition, by using the solder balls 50 of the second preferred embodiment, a highly reliable semiconductor interconnect structure, in which the solder balls 50 are soldered with the substrate 20 with so strongly that misalignment or any other defect rarely happens, can be provided as in the first preferred embodiment. Such a semiconductor interconnect structure may be made by the same method as that already described for the first preferred embodiment with reference to FIG. 3.

Hereinafter, specific examples of the present invention will be described.

EXAMPLE 4

In a solder ball 50 representing a fourth specific example of the present invention, the solder layer 4 is a single Sn—Ag alloy layer. Hereinafter, a method of making the solder ball 50 of the fourth specific example will be described.

First, a spherical copper core 2 with a diameter of 0.85 mm is prepared. Meanwhile, a solution including 15 g/l of tris(3-hydroxypropyl)phosphine, Sn methanesulfonate (24 g/l of Sn), Ag methanesulfonate (0.7 g/l of Ag), 60 g/l of methanesulfonate, and 5 g/l of thiourea is prepared, and an ammonia salt is added thereto, thereby preparing a plating solution with the PH controlled to 4.0.

Next, the core is plated with this plating solution at a current density of 0.30 A/dm² and at a bath temperature of 30° C. using Sn as an anode electrode, thereby forming an Sn—Ag alloy plating layer 4 (with a thickness of 35 μm) on the surface of the copper core 2. This electroplating process is carried out within a barrel container.

In this manner, a solder ball representing the fourth specific example (of which the solder layer 4 includes 1.8 mass % of Ag) was obtained.

EXAMPLE 5

In a solder ball 50 representing a fifth specific example of the present invention, the solder layer 4 is also a single Sn—Ag alloy layer as in the fourth specific example. Hereinafter, a method of making the solder ball 50 of the fifth specific example will be described.

First, a spherical copper core 2 with a diameter of 0.60 mm is prepared. Meanwhile, a solution including 20 g/l of tris(3-hydroxypropyl)phosphine, Sn methanesulfonate (24 g/l of Sn), Ag methanesulfonate (0.95 g/l of Ag), 70 g/l of methanesulfonate, and 5 g/l of thiourea is prepared, and an ammonia salt is added thereto, thereby preparing a plating solution with the PH controlled to 4.0.

Next, the core is plated with this plating solution at a current density of 0.30 A/dm² and at a bath temperature of 20° C. using Sn as an anode electrode, thereby forming an Sn—Ag alloy plating layer 4 (with a thickness of 20 μm) on the surface of the copper core 2. This electroplating process is carried out within a barrel container.

In this manner, a solder ball representing the fifth specific example (including 2.4 mass % of Ag) was obtained.

EXAMPLE 6

In a solder ball 50 representing a sixth specific example of the present invention, the solder layer 4 consists of an Sn—Ag alloy layer 6 and an Ag layer 8. Hereinafter, a method of making the solder ball 50 of the sixth specific example will be described.

First, a spherical copper core 2 with a diameter of 0.50 mm is prepared. Meanwhile, a solution including 13 g/l of tris(3-hydroxypropyl)phosphine, Sn methanesulfonate (24 g/l of Sn), Ag methanesulfonate (0.4 g/l of Ag), and 50 g/l of methanesulfonate is prepared, and an ammonia salt is added thereto, thereby preparing a plating solution with the PH controlled to 4.0.

Next, the core is plated with this plating solution at a current density of 0.30 A/dm$^2$ and at a bath temperature of 30° C. using Sn as an anode electrode, thereby forming an Sn—Ag alloy layer 6 (with a thickness of 10 μm) on the surface of the copper core 2. The alloy layer 6 includes 1.0 mass % of Ag.

Then, an Ag layer 8 (with a thickness of 0.17 μm) is deposited on the alloy layer 6 by an electroplating process using a silver iodide plating bath. This electroplating process is carried out within a barrel container.

In this manner, a solder ball representing the sixth specific example was obtained. In this solder ball, the solder layer 4 consists of the Sn—Ag alloy layer 6 and the Ag layer 8 and includes 3.5 mass % of Ag.

For the purpose of comparison, solder balls representing the fourth through sixth comparative examples to be described below were also made.

COMPARATIVE EXAMPLE 4

A solder ball representing a fourth comparative example is different from the fourth specific example in that the electroplating process is carried out with the following plating solution. Specifically, the plating solution for use in this fourth comparative example includes Sn methanesulfonate (20 g/l of Sn), Ag methanesulfonate (0.3 g/l of Ag), and 100 g/l of methanesulfonate and its PH is controlled to less than 1.0.

The plating process is carried out under the same conditions as those of the fourth specific example, except that this plating solution is used at a bath temperature of 25° C., thereby forming an Sn—Ag alloy plating layer (with a thickness of 35 μm) on the surface of the copper core. In this manner, a solder ball representing the fourth comparative example (including 1.8 mass % of Ag) was obtained.

COMPARATIVE EXAMPLE 5

A solder ball representing a fifth comparative example is different from the fifth specific example in that the electroplating process is carried out with the following plating solution. Specifically, the plating solution for use in this fifth comparative example includes Sn sulfate (17 g/l of Sn), Ag sulfate (0.4 g/l of Ag), and 200 g/l of potassium iodide and its PH is controlled to 9.0.

The plating process is carried out under the same conditions as those of the fifth specific example, except that this plating solution is used at a bath temperature of 25° C., thereby forming an Sn—Ag alloy plating layer (with a thickness of 20 μm) on the surface of the copper core. In this manner, a solder ball representing the fifth comparative example (including 2.4 mass % of Ag) was obtained.

COMPARATIVE EXAMPLE 6

A solder ball representing a sixth comparative example is different from the sixth specific example in that the Sn—Ag alloy is plated using the following plating solution. Specifically, the plating solution for use in this sixth comparative example includes Sn methanesulfonate (18 g/l of Sn), Ag methanesulfonate (0.2 g/l of Ag), and 100 g/l of methanesulfonate and its PH is controlled to less than 1.0.

The plating process is carried out under the same conditions as those of the sixth specific example, except that this plating solution is used at a bath temperature of 25° C., thereby forming an Sn—Ag alloy plating layer (with a thickness of 10 μm) on the surface of the copper core. The alloy plating layer includes 1.0 mass % of Ag.

Then, as in the sixth specific example, an Ag layer (with a thickness of 0.17 μm) is deposited on the alloy plating layer using a silver iodide plating bath.

In this manner, a solder ball representing the sixth comparative example was obtained. In this solder ball, the solder layer consists of the Sn—Ag alloy plating layer and the Ag layer and includes 3.5 mass % of Ag.

Evaluation

To evaluate the solder balls of the specific and comparative examples, the amounts of water contained in respective solder balls were calculated. Also, those solder balls were heated and melted to count the number of voids created and measure the maximum diameter thereof. Furthermore, those solder balls were subjected to a bonding test.

The maximum diameter and the number of voids were obtained in the following manner. First, as shown in FIG. 4(a), the solder ball was put on a Cu substrate 30 with a flux 32 interposed on the principal surface thereof. Next, as shown in FIG. 4(b), the solder ball was heated at 250° C. for 10 seconds, thereby melting the solder layer 4 (i.e., turning it into molten solder 4A). Thereafter, as shown in FIG. 4(c), the Cu core portion was removed from the solder ball. The fracture, exposed by removing the Cu core, was photographed from over it, the number of voids created on the fracture was counted, and the maximum diameter thereof was measured. Only the number of voids with diameters of at least 10 μm was counted.

The bonding test was carried out in the following manner. Specifically, 100 solder balls were put on the Cu substrate 30 as shown in FIG. 4(a). Next, as shown in FIG. 4(b), the solder layer 4 was heated and melted and then cooled and solidified, thereby bonding the solder layer 4 onto the substrate 30. This heating and melting process step was carried out by loading the substrate 30, on which the solder balls were arranged, in an oven having an internal temperature of 250° C. and replaced with a nitrogen atmosphere for 10 seconds. Thereafter, the substrate 30 was unloaded from the oven and then cooled by itself to room temperature.

Then, it was counted how many solder balls came off (or dropped from) the substrate 30 among the 100 balls obtained by the method described above.

Results

The amounts of water contained, the numbers of voids created and its maximum diameter measured for the fourth to sixth specific examples and the fourth to sixth comparative examples and the numbers of balls dropped in the bonding test are shown in the following Table 2:

TABLE 2

| | Amount of water (μl/g) | Maximum void diameter (μm) | Number of voids | Number of balls dropped (in 100 balls) |
|---|---|---|---|---|
| Example 4 | 50 | — | 0 | 0 |
| Example 5 | 70 | — | 0 | 0 |
| Example 6 | 80 | — | 0 | 0 |
| Comp. Ex. 4 | 200 | 80 | 14 | 1 |
| Comp. Ex. 5 | 200 | 70 | 16 | 1 |
| Comp. Ex. 6 | 200 | 60 | 12 | 1 |

As can be seen from Table 2, each of the solder balls of the fourth through sixth specific examples contained an amount of water of less than 100 μl/g, whereas each of the solder balls of the fourth through sixth comparative examples contained an amount of water of 200 μl/g.

As can be seen from Table 2, no voids were detected at all in the fourth through sixth specific examples, while 12 to 16 voids with diameters of 60 to 80 μm were detected per mm$^2$ in the fourth through sixth comparative examples. Thus, the present inventors confirmed that the creation of voids was minimized effectively in the solder ball of this specific example containing an amount of water of less than 100 μl/g. As also can be seen from Table 2, no bonding failures were spotted at all in the fourth through sixth specific examples, while a bonding failure was spotted in the fourth through sixth comparative examples. Consequently, the solder ball of this specific example turned out to be bondable even more firmly.

INDUSTRIAL APPLICABILITY

The present invention provides a solder ball that includes an Sn—Ag based solder layer, in which the creation of voids is minimized while the solder layer is being heated and melted, and also provides a method of making such a ball. A solder ball according to the present invention can be used effectively as an input/output terminal for a BGA or a CSP, for example.

The invention claimed is:

1. A method of making a solder ball, the method comprising the steps of:
   preparing a spherical core;
   forming a plating layer, including Sn and Ag, by an electroplating technique such that the plating layer wraps the core up;
   heating the core with the plating layer, thereby keeping the plating layer molten for a predetermined period of time; and
   solidifying the molten plating layer, thereby making a solder layer,
   wherein the step of forming the plating layer includes the step of forming an alloy plating layer including Sn and Ag and wherein the step of forming the plating layer includes the step of forming an additional plating layer including Ag.

2. The method of claim 1, wherein the step of forming the plating layer includes the steps of:
   forming a first plating layer, including Sn, such that the first plating layer wraps the core up, and
   forming a second plating layer, including Ag, such that the second plating layer also wraps the core up.

3. The method of claim 1, wherein the solder layer includes Cu, Sn and Ag.

4. The method of claim 3, wherein the solder layer includes 0.5 mass % to 4.0 mass % of Ag.

5. The method of claim 3, wherein the solder layer includes 3.5 mass % of Ag.

6. A method of making a solder ball, the method comprising the steps of preparing a spherical core, and
   forming a solder layer, including Sn and Ag, such that the solder layer wraps the core up,
   wherein the step of forming the solder layer includes the step of forming a first solder layer, including an Sn—Ag alloy, by an electroplating process that uses a plating solution including 10 g/l to 25 g/l of tris (3-hydroxypropyl)phosphine, 15 g/l to 25 g/l of Sn organosulfonate, 0.3 g/l to 1.5 g/l of Ag organosulfonate, 50 g/l to 100 g/l of organic sulfonic acid, and ammonia, and
   wherein the first solder layer includes 0.5 mass % to 2.5 mass % of Ag.

7. The method of claim 6, wherein the plating solution further includes 3 g/l to 12 g/l of thiourea.

8. The method of claim 6, wherein the step of forming the solder layer further includes the step of forming a second solder layer including Ag.

9. The method of claim 8, wherein the second solder layer is formed by an electroplating process, an evaporation process or a colloidal process.

10. The method of claim 9, wherein the second solder layer is formed by the electroplating process and has a thickness of at most 0.5 μm.

11. The method of claim 8, wherein the solder layer includes 3.0 mass % to 4.0 mass % of Ag.

12. The method of claim 6, wherein the first solder layer has a thickness of 3 μm to 50 μm.

13. The method of claim 6, wherein the core is made of Cu, Al or a resin.

14. The method of claim 6, wherein the solder layer includes 3.5 mass % of Ag.

15. The method of claim 6, wherein the core has a diameter of 0.05 mm to 1 mm.

16. A solder ball comprising
   a spherical core, and
   a solder layer, which includes Sn and Ag and which is provided so as to wrap the core up,
   wherein the solder layer includes a first solder layer made of an Sn—Ag alloy, and
   wherein the first solder layer includes 0.5 mass % to 2.5 mass % of Ag, and
   wherein an amount of water contained in the solder layer is 100 μl/g or less when represented by an amount of water vapor in standard conditions,
   wherein the solder layer further includes a second solder layer, which is provided so as to wrap up the first solder layer, and wherein the second solder layer includes Ag and has a thickness of at most 0.5 μm.

17. The solder ball of claim 16, wherein the solder layer includes 3.0 mass % to 4.0 mass % of Ag.

18. The solder ball of claim 16, wherein the first solder layer has a thickness of 3 μm to 50 μm.

19. The solder ball of claim 16, wherein the core is made of Cu, Al or a resin.

20. The solder ball of claim 17, wherein the solder layer includes 3.5 mass % of Ag.

21. The solder ball of claim 16, wherein the core has a diameter of 0.05 mm to 1 mm.

* * * * *